(12) United States Patent
Kakamu

(10) Patent No.: US 6,878,619 B2
(45) Date of Patent: Apr. 12, 2005

(54) METHOD FOR FABRICATING SEMICONDUCTOR DEVICE

(75) Inventor: Katsumi Kakamu, Kasugai (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/341,430

(22) Filed: Jan. 14, 2003

(65) Prior Publication Data

US 2003/0216052 A1 Nov. 20, 2003

(30) Foreign Application Priority Data

May 14, 2002  (JP) ...................................... 2002-138273

(51) Int. Cl.[7] ......................................... H01L 21/4763
(52) U.S. Cl. ........................ 438/631; 438/645; 257/751
(58) Field of Search ................................. 257/750–760, 257/632–638, 646; 427/577; 438/687, 723, 622–675, 703–707, 724, 744, 757, 761–763, 783, 791; 430/311–322

(56) References Cited

U.S. PATENT DOCUMENTS 6,030,901 A * 2/2000 Hopper et al. .............. 438/711
6,121,146 A * 9/2000 Yoon et al. ................. 438/692
6,316,329 B1 * 11/2001 Hirota et al. ............... 438/424
6,455,409 B1 * 9/2002 Subramanian et al. ...... 438/618

FOREIGN PATENT DOCUMENTS

| JP | 63-168810 A | 7/1988 |
| JP | 05-090226 | 4/1993 |
| JP | 09-082798 A | 3/1997 |

* cited by examiner

*Primary Examiner*—Matthew Smith
*Assistant Examiner*—Calvin Lee
(74) *Attorney, Agent, or Firm*—Westerman, Hattori, Daniels & Adrian, LLP

(57) ABSTRACT

The method comprises the steps of sequentially forming a USG film 32, an SiN film 34, a USG film 36, a carbon film 50 and an anti-reflection coating 52 for protecting the carbon film 50 from ashing, forming a resist film 56 with openings in prescribed regions on the anti-reflection coating 52, etching the anti-reflection film 52 and the carbon film 50 with the resist film 56 as a mask, removing the resist film by ashing, and anisotropically etching the USG films 36, 32 with the carbon film 50 as a hard mask. Accordingly, the insulation film can be etched at a high selective ratio, and the increase of dimensions of a pattern of the mask with respect to dimension of a pattern of the resist film used in the patterning can be suppressed.

17 Claims, 17 Drawing Sheets

METHOD FOR FABRICATING SEMICONDUCTOR DEVICE

CROSS-REFERENCE TO RELATED APPLICATION

This application is based upon and claims priority of Japanese Patent Application No. 2002-138273, filed on May 14, 2002, the contents being incorporated herein by reference.

BACKGROUND OF THE INVENTION

The present invention relates to a method for fabricating a semiconductor device, more specifically to a method for fabricating a semiconductor device comprising the step of etching inter-layer insulation films, etc. by using masks.

The dual damascening, in which an interconnection and via plugs are concurrently formed, can decrease times of burying metals and planarization by CMP (chemical metal polishing), and has a merit of decreasing the interconnecting costs. The dual damascening is widely used in forming multi-interconnection layer structure of semiconductor devices.

A method for forming a multi-interconnection layer structure by the conventional dual damascening will be explained with reference to FIGS. 12A–12B to 17A–17B. FIGS. 12A–12B to 17A–17B are sectional views of the multi-interconnection layer structure in the steps of the method for forming the multi-interconnection layer structure, which explain the method. The method will be explained by means of an example in which a via layer connected to a first interconnection layer which is the first layer, and a second interconnection layer are formed.

First, the structure of the first layer, which is the first interconnection layer, will be explained with reference to FIG. 12A.

A Transistor including a gate electrode 102 and source/drain diffused layers 104 are formed on a silicon substrate 100.

An inter-layer insulation film 108 of USG (undoped silicate glass) is formed on the silicon substrate 100 with the transistor formed on. A contact hole 110 is formed in the inter-layer insulation film 108 down to the source/drain diffused layer 104. A conductor plug 112 of tungsten (W) is buried in the contact hole 110.

In the inter-layer insulation film 108, a first interconnection groove 114 having a first layer interconnection pattern connected to the conductor plug 112 is formed. A tantalum nitride (TaN) film 116 is formed on the inside surface and the bottom surface of the first interconnection groove 114, and the first interconnection layer 118 of Cu is buried in the first interconnection groove 14 with the TaN film 116 formed on.

A SiN film 120 is formed on the entire surface of the inter-layer insulation film 108 with the first interconnection layer 118 buried in.

Then, the step of forming a via layer and a second interconnection layer connected to the above-described first interconnection layer 118 will be explained.

First, on the SiN film 120, an inter-layer insulation film 122 of USG, a SiN film 124, an inter-layer insulation film 126 of USG and a SIN film 128 are formed (FIG. 12B).

Then, on the SiN film 128, an ARC (anti-reflection coating) 130 of a silicon nitride oxide (SiON) film for patterning a resist film, and a resist film 134 are sequentially formed.

Next, an opening for exposing a region for a via hole 132 to be formed in is formed in the resist film 134 by photolithography (FIG. 13A).

Then, with the resist film 134 with the opening formed in as a mask and with the SiN film 124 as an etching stopper, the anti-reflection coating 130, the SiN film 128 and the inter-layer insulation film 126 are etched.

After the etching, the resist film 134 is removed by ashing using, e.g., oxygen plasmas (FIG. 13B).

Next, a resist film 136 is formed on the entire surface, and an opening for exposing a region for the second interconnection groove 138 to be formed in the resist film 136 by photolithography (FIG. 14A).

Then, with the resist film 136 with the opening formed in as a mask, the anti-reflection coating 130, and the SiN film 128 are etched. The SiN film 128 as a mask for forming the via hole 132 and the second interconnection groove 138 is thus patterned. Concurrently therewith, the SiN film 124 which is used as the etching stopper and exposed by etching the inter-layer insulation film 126 is also etched. After the etching has completed, the resist film 136 is removed by ashing using, e.g., oxygen plasmas (FIG. 14B).

Next, with the SiN film 128 as a mask and with the SiN films 124, 120 as an etching stopper, the inter-layer insulation films 126, 122 are etched. Concurrently therewith, the anti-reflection coating 130 of the SiON film is etched (FIG. 15A).

Next, the SiN films 124, 120 which are used as the etching stopper and exposed by etching the inter-layer insulation films 126, 122 are etched. The via hole 132 down to the first interconnection layer 118, and the second interconnection groove 138 are thus formed (FIG. 15B).

Then, a TaN film 140 is formed on the entire surface. Next, the TaN film 140 except that formed on the inside surface and the bottom of the second interconnection groove 138 and the via hole 132 is removed by CMP (FIG. 16A).

Next, a Cu film (not shown) is formed on the entire surface by, e.g., sputtering. Then, with the Cu film formed by sputtering as a seed layer, a Cu film 142 is formed by plating (FIG. 16B).

Then, the Cu film 142 is polished by CMP until the surface of the inter-layer insulation film 126 is exposed. Thus, the via layer 144 and the second interconnection layer 146 of the same Cu film 142 are formed in the via hole 132 and the second interconnection groove 138 (FIG. 17A).

Next, a SiN film 148 is formed on the entire surface as a diffusion preventing film for preventing the diffusion of the Cu (FIG. 17B).

Hereafter, in accordance with a structure of a semiconductor device to be fabricated, the above-described steps are repeated to thereby form a multi-interconnection layer structure comprising a plurality of interconnection layers is fabricated.

However, the above-described conventional method for fabricating a semiconductor device has the following disadvantages when a SiN film is used as a mask for etching the inter-layer insulation film of USG or others to thereby form the via hole and the interconnection groove.

First, in etching the inter-layer insulation film of USG or others, the etching selective ratio of the SiN film used as a mask is not enough. When the via hole and the interconnection groove are etched, pattern dimensions on the mask often become larger than pattern dimensions on the resist film.

The SiN film must be formed considerably thick so that the SiN film can function as a mask. Resultantly, even when the SiN film on the bottom of the via hole, which has been used as the etching stopper, has been removed by etching, as shown in FIG. 15B, the SiN film of the upper layer used as the mask often remains. Because of such residue of the SiN film used as the mask, an effective dielectric constant between the layers is often increased.

SUMMARY OF THE INVENTION

An object of the present invention is to provide a method for fabricating a semiconductor device in which inter-layer insulation films, etc. are etched to form via holes, interconnection grooves, etc. while the enlargement of pattern dimensions of a mask is suppressed, and the used mask can be sufficiently removed.

According to one aspect of the present invention, there is provided a method for fabricating a semiconductor device comprising the steps of: sequentially forming on a substrate an insulation film, a carbon film and a protection film protecting the carbon film from ashing; forming a resist film with an opening in a prescribed region on the protection film; etching the protection film and the carbon film with the resist film as a mask; removing the resist film by ashing; and etching the insulation film with the carbon film as a mask.

According to another aspect of the present invention, there is provided a method for fabricating a semiconductor device comprising the steps of: sequentially forming on a substrate a first insulation film, a second insulation film having etching characteristics different from those of the first insulation film, and a third insulation film having etching characteristics different from those of the second insulation film; forming a carbon film having a first opening in a first region on the third insulation film; anisotropically etching the third insulation film and the second insulation film in the first region; forming a second opening in the carbon film in a second region containing the first region; and anisotropically etching the first insulation film and the third insulation film with the carbon film and the second insulation film as a mask to form a via hole in the first insulation film in the first region, and a interconnection groove in the third insulation film in the second region.

As described above, the present invention comprises the steps of sequentially forming on a substrate an insulation film, a carbon film and a protecting film from protecting the carbon film from ashing, forming a resist film with a opening in a prescribed in region on the protection film, etching the protection film and the carbon film with the resist film as a mask, removing the resist film by ashing, and etching the insulation film with the carbon film as a mask, whereby the insulation film can be etched at a high selective ratio. The increase of dimensions of a pattern of the mask with respect to dimension of a pattern of the resist film used in the patterning can be suppressed.

The present invention comprises the steps of sequentially forming on a substrate a first insulation film, a second insulation film having etching characteristics different from those of the first insulation film, and a third insulation film having etching characteristics different from those of the second insulation film, forming a carbon film having first an opening in a first region on the third insulation film, anisotropically etching the third insulation film in the first region, and the second insulation film, forming a second opening in the carbon film in a second region containing the first region, and anisotropically etching the first insulation film and the third insulation film with the carbon film and the second insulation film as masks to form a via hole in the first insulation film in the first region, and a interconnection groove in the third insulation film in the second region, whereby the first insulation film and the third insulation film can be etched at a high selective ratio. The increase of dimensions of a pattern of the mask with respect to dimension of a pattern of the resist film used in the patterning can be suppressed, and the via hole and the interconnection groove can be formed with high accuracy.

According to the present invention, the carbon film is used as a mask, whereby the insulation film can be etched at high selective ratio. The mask can be thin. The mask can be removed accordingly sufficiently in a later step, whereby the increase of an inter-layer effective dielectric constant of a multi-interconnection structure can be suppressed.

DETAILED DESCRIPTION OF THE INVENTION

[A First Embodiment]

Figure 1:
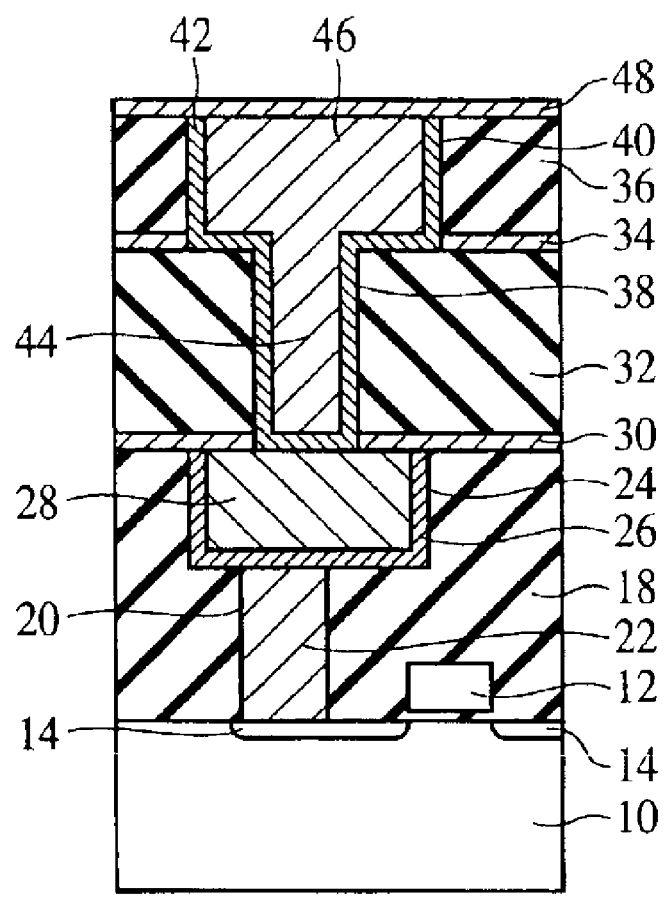
FIG. 1 is a diagrammatic sectional view of a semiconductor device according to a first embodiment of the present invention, which shows a structure thereof.

The method for fabricating a semiconductor device according to a first embodiment of the present invention will be explained with reference to FIGS. 1 to 7A–7B. FIG. 1 is a diagrammatic sectional view of a semiconductor device according to the present embodiment, which shows a structure thereof. FIGS. 2A–2B to 7A–7B are sectional views of the semiconductor device in the steps of the method for fabricating a semiconductor device according to the present embodiment, which show the method.

First, the structure of the semiconductor device according to the present embodiment will be explained with reference to FIG. 1.

A transistor comprising a gate electrode 12 and a source/drain diffused layers 14 are formed on a silicon substrate 10.

An inter-layer insulation film 18 of USG is formed on the silicon substrate 10 with the transistor formed on. A contact hole 20 is formed in the inter-layer insulation film 18 down to the source/drain diffused layer 14 formed on the silicon substrate 10. A conductor plug 22 of W is buried in the contact hole 20.

A first interconnection groove 24 having a first layer interconnection pattern connected to the conductor plug 22 is formed in the inter-layer insulation film 18. A TaN film 26 as a barrier film for preventing the diffusion of Cu to the inter-layer insulation film is formed on the inside surface of the first interconnection groove 24 and the bottom thereof. A first interconnection layer 28 of Cu is buried in the first interconnection groove 24 with the TaN film formed on.

A SiN film 30 is formed on the entire surface of the inter-layer insulation film 18 with the first interconnection film 28 buried in. On the SiN film 30, an inter-layer insulation film 32 of USG, a SiN film 34 and an inter-layer insulation film 36 of USG are sequentially formed.

A via hole 38 is formed in the SiN film 30 and the inter-layer insulation film 32 down to the first interconnection layer 28.

A second interconnection groove 40 having a second layer interconnection pattern reaching the via hole 38 is formed in the SiN film 34 and the inter-layer insulation film 36. A TaN film 42 as a barrier film for preventing the diffusion of Cu to the inter-layer insulation film is formed on the inside surface of the second interconnection groove 40 and the bottom thereof. A via layer 44 and a second interconnection layer 46 formed of one and the same Cu film are formed integrally in the via hole 38 and the second interconnection groove 40.

A SiN film 48 is formed on the entire surface of the inter-connection film 36 with the second interconnection layer 46 buried in.

The multi-interconnection layer structure is thus formed on the silicon substrate 10.

Next, the method for fabricating a semiconductor device according to the present embodiment will be explained with reference to FIGS. 2A–2B to 7A–7B.

Figure 2A:
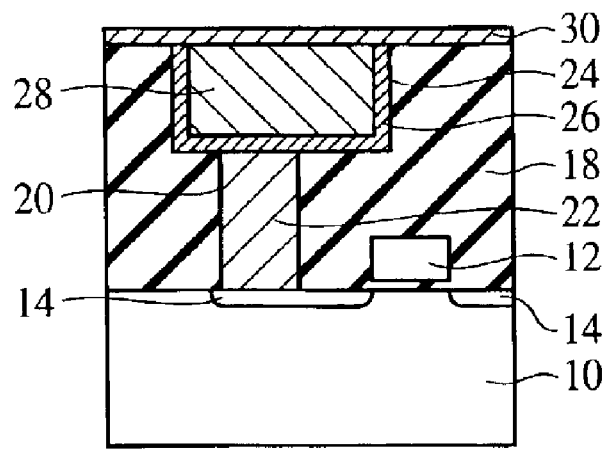
FIGS. 2A and 2B are sectional views of the semiconductor device in the steps of the method for fabricating a semiconductor device according to the first embodiment, which show the method (Part 1).

First, the conductor plug 22 connected to the source/drain diffused layer 14, and the first interconnection layer 28 connected to the conductor plug 22 are formed in the inter-layer insulation film 18 of USG on the silicon substrate 10 with the transistor formed on. Next, the SiN film 30 is formed on the entire surface of the inter-layer insulation film 18 with the first interconnection layer 28 formed on (FIG. 2A). These steps can be performed in accordance with the usual semiconductor device fabrication process.

Then, the inter-layer insulation film 32 of USG is formed on the SiN film 30. Next, the SiN film 34 is formed on the inter-layer insulation film 32. Then, the inter-layer insulation film 36 of USG is formed on the SiN film 34.

Figure 2B:
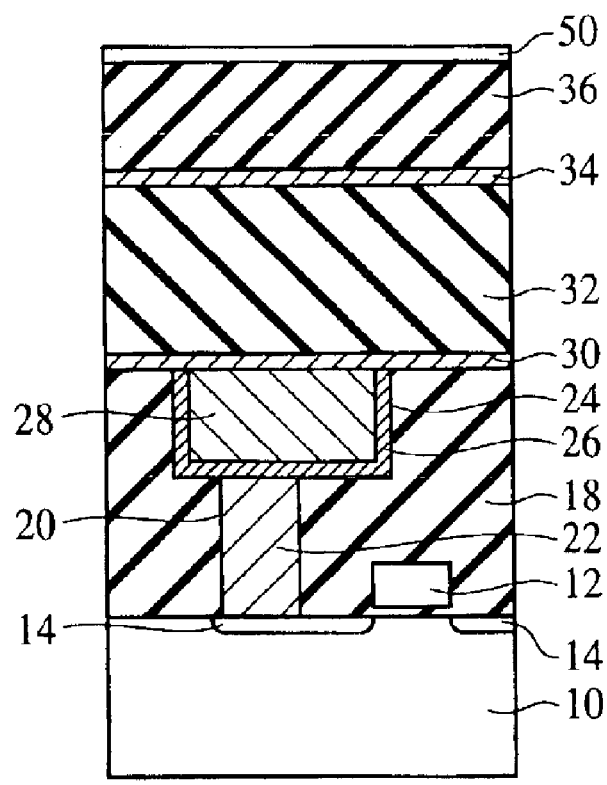

Then, a carbon film 50 of, e.g., a 50 nm-thickness is formed on the inter-layer insulation film 36 by, e.g., CVD (FIG. 2B). The carbon film 50 can be formed by not only CVD but also by sputtering, PVD (physical vapor deposition) or others. When the carbon film is formed by PVD, the carbon film is formed without heating the substrate, e.g., at a 5 mTorr argon gas pressure and a 1 kW DC power, and with a carbon target of a below 0.1 Ωcm resistivity.

The carbon film 50 formed here is to be used as a mask for etching to form a via hole and an interconnection groove in a later step.

The carbon film 50 has a lower etching rate under conditions for etching the inter-layer insulation film of USG. By using the carbon film 50 as a mask, the inter-layer insulation film can be etched at a high selective ratio. Accordingly, the mask can be thinner than the conventional mask of SiN film, which permits the mask to be sufficiently removed, with a result that, the increase of an inter-layer effective dielectric constant can be suppressed.

Then, a anti-reflection coating 52 of a SiN film and a resist film 54 are sequentially formed on the carbon film 50. The anti-reflection coating 52 formed here is to function not only as the anti-reflection coating, but also as a protection film for protecting the carbon film 50 from ashing using oxygen plasmas in the step of removing the resist film 54.

Figure 3A:
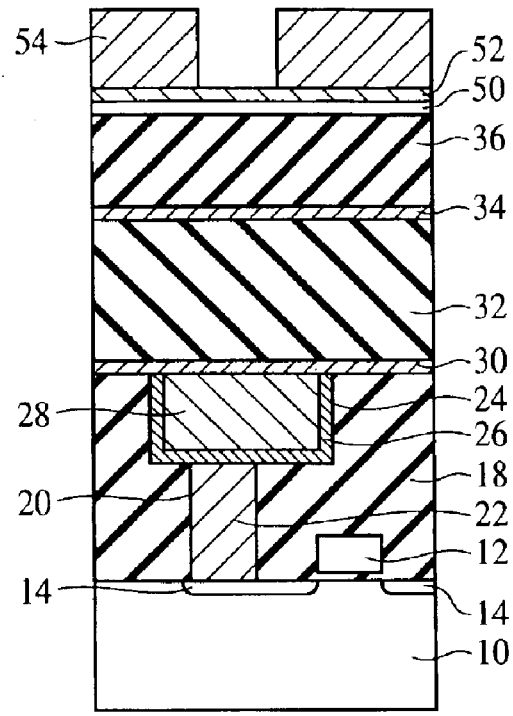
FIGS. 3A and 3B are sectional views of the semiconductor device in the steps of the method for fabricating a semiconductor device according to the first embodiment, which show the method (Part 2).

Next, an opening for exposing a region for the via to be formed in is formed in the resist film 54 by photolithography (FIG. 3A).

Then, with the resist film 54 with the opening formed in as a mask and with the SiN film 34 as an etching stopper, the anti-reflection film 52, the carbon film 50, the inter-layer insulation film 36 are etched. The etching has three stages; gases are, for example, $CHF_3$ for etching the anti-reflection coating, $NH_3$, $H_2$, $O_2$ and Ar for etching the carbon film, and $C_5F_8$, $O_2$ and Ar for etching the inter-layer insulation film. Conditions for etching the anti-reflection coating by a parallel plate etching system are, e.g., a 40 cc/min feed rate of $CHF_3$, a 20 cc/min feed rate of $O_2$, a 1000 W RF (27 MHz, opposed electrode) output, a 600 W RF (2 MHz, substrate), a 30° C. stage temperature and a 30 mTorr pressure. Conditions for etching the inter-layer insulation film are, e.g., a 15 cc/min $C_5F_8$ feed rate, a 18 cc/min $O_2$ feed rate, a 800 cc/min Ar feed rate, a 1300 W RF (27 MHz, opposed electrode) output, a 1500 W RF (2 MHz, substrate) output, a 1500 W RF (2 MHz, substrate) output, a 30° C. stage temperature and a 30 mTorr pressure.

Figure 3B:
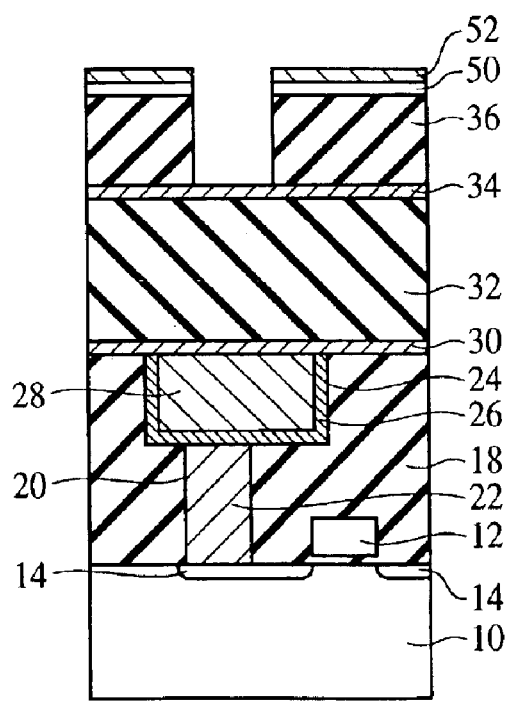

After the etching has been completed, the resist film 54 is removed by ashing using, e.g., oxygen plasmas (FIG. 3B). Because of the anti-reflection coating 52 of SiN film formed on the carbon film 50, the carbon film 50 is protected from the ashing. Accordingly, the carbon film 50 is never removed together with the resist film 54.

Figure 4A:
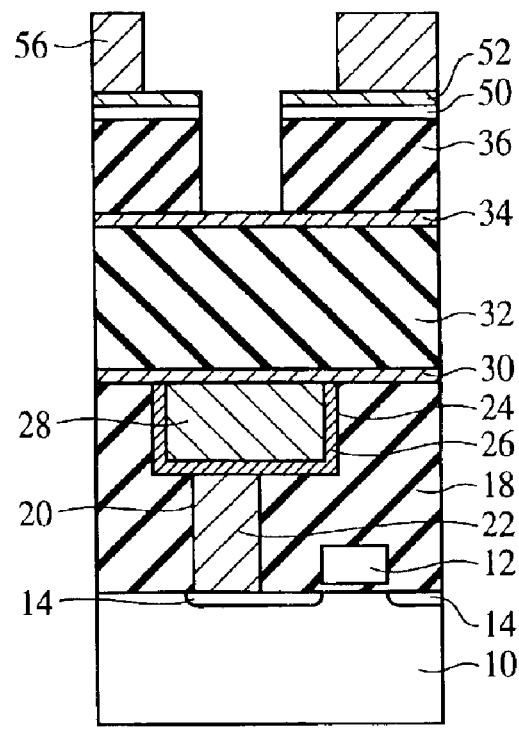
FIGS. 4A and 4B are sectional views of the semiconductor device in the steps of the method for fabricating a semiconductor device according to the first embodiment, which show the method (Part 3).

Then, the resist film 56 is formed on the entire surface, and an opening for exposing a region for the second interconnection groove 40 to be formed in is opened in the resist film 56 by photolithography (FIG. 4A).

Next, with the resist film 56 with the opening formed in, the anti-reflection film 52 and the carbon film 50 are etched. For the etching, gases of, e.g., $C_5F_8$, $O_2$ and Ar are used. Conditions for the etching by means of the parallel plate etching system are, e.g., a 10 cc/min $C_5F_8$ feed rate, a 12 cc/min $O_2$ feed rate, a 400 cc/min Ar feed rate, a 1300 W RF (27 MHz, opposed electrode) output, a 1300 W RF (32 MHz, substrate) output, a 40° C. stage temperature and a 30 mTorr pressure.

The carbon film 50 as a mask for forming the second interconnection groove 40 is thus patterned. Concurrently therewith, the SiN film 34 as well which has been used as an etching stopper and exposed by etching the inter-layer insulation film 36 is also etched.

Figure 4B:
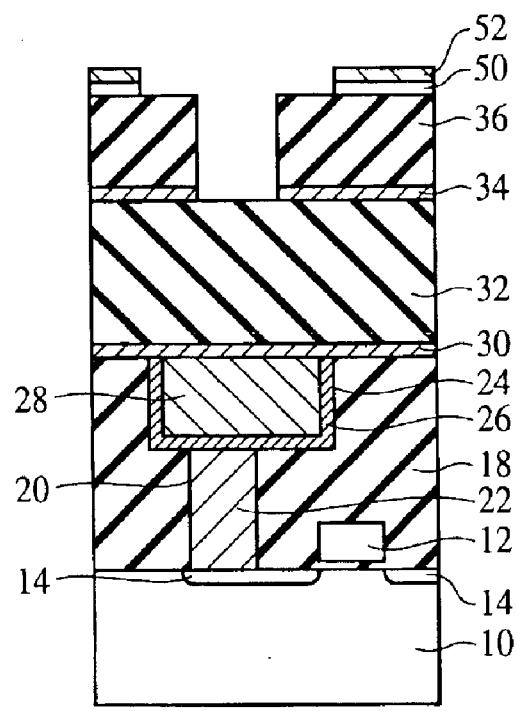

After the etching, the resist film 56 is removed by ashing using, e.g., oxygen plasmas (FIG. 4B). Because of the anti-reflection film 52 of the SiN film, the carbon film 50 is never removed together with the resist film 56, as was not in removing the resist film 54.

Figure 5A:
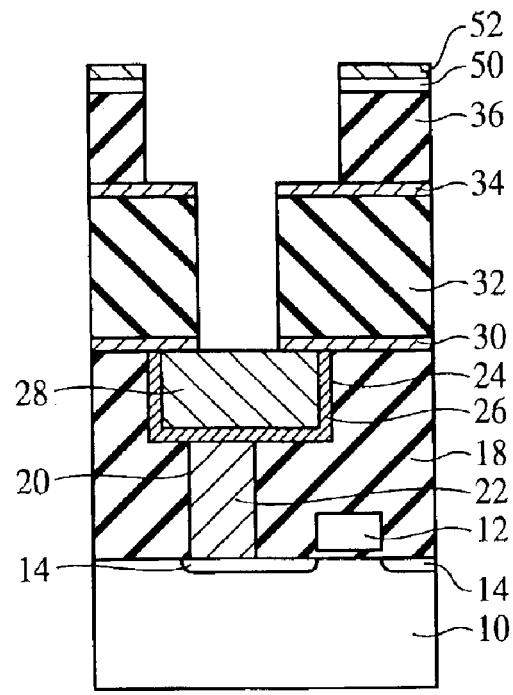
FIGS. 5A and 5B are sectional views of the semiconductor device in the steps of the method for fabricating a semiconductor device according to the first embodiment, which show the method (Part 4).

Next, with the carbon film 50 as a mask and the SiN films 34, 30 as etching stoppers, the inter-layer insulation films 36, 32 are etched (FIG. 5A). For the etching, gases of e.g., $CH_2F_2$, $C_5F_8$, $O_2$ and Ar are used. Conditions for the etching by means the parallel plate etching system are, e.g., a 20 cc/min $CH_2F_2$ feed rate, a 2 cc/min $C_5F_8$ feed rate, a 26 cc/min $O_2$ feed rate, a 200 cc/min Ar feed rate, a 1200 W RF (27 MHz, opposed electrode) output, a 300 W RF (2 MHz, substrate) output, a 30° C. stage temperature and a 40 mTorr pressure.

As described above, the present embodiment is characterized mainly in that with the carbon film 50 as a mask, the inter-layer insulation film of USG is etched to form the second interconnection groove 40 and the via hole 38. The carbon film 50 has a low etching rate under the conditions for etching the USG film forming the inter-layer insulation films. Accordingly, the inter-layer insulation films can be etched at a high selective ratio, whereby dimensions of the pattern of the mask never increase with respect to dimensions of the pattern formed on the resist film 56. Thus the second interconnection groove 40 and the via hole 38 can be formed with high accuracy.

The carbon film 50 is used as a mask, whereby the inter-layer insulation film of USG can be etched at a high selective ratio, which allows the mask to be thin. The mask is thus allowed to be thin, and the mask can be sufficiently removed in a later step. Accordingly, the increase of an inter-layer effective dielectric constant can be suppressed.

Figure 5B:
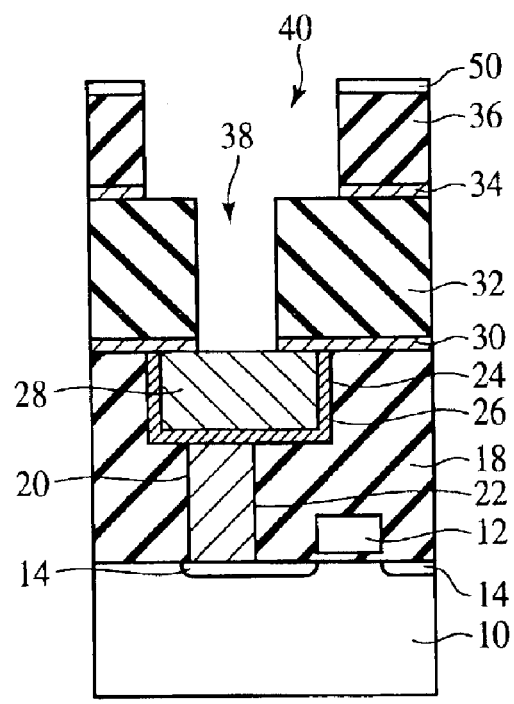

Then, the SiN films 34, 30 which have been used etching stoppers and exposed by etching the inter-layer insulation films are etched. The via hole 38 reaching the first interconnection layer 28, and the second interconnection groove 40 are thus formed. Concurrently therewith, the anti-reflection coating 52 of the SiN film is also etched (FIG. 5B). It is preferable to set a film thickness of the anti-reflection coating 52 so that the anti-reflection coating 52 is removed concurrently with etching the SiN films 34, 30. The fabrication steps can be thus efficiently advanced.

Figure 6A:
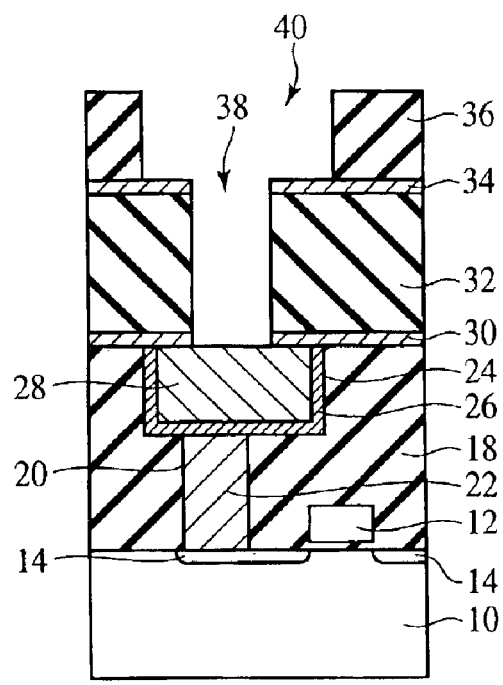
FIGS. 6A and 6B are sectional views of the semiconductor device in the steps of the method for fabricating a semiconductor device according to the first embodiment, which show the method (Part 5).

Next, the carbon film 50 which has been used as the mask is removed (FIG. 6A).

Figure 6B:
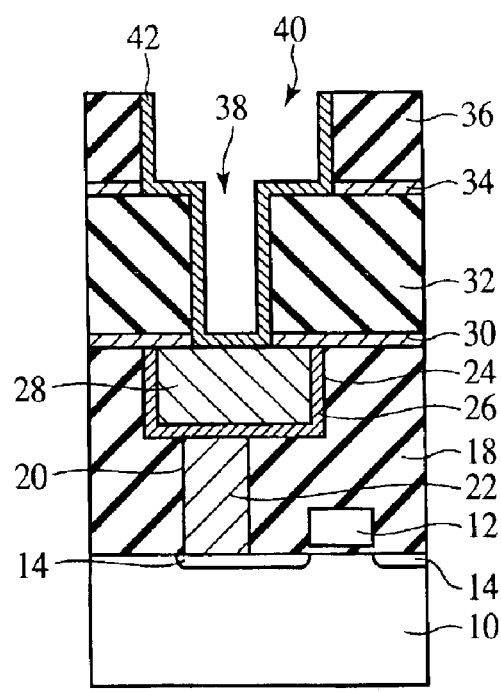

Then, the TaN film 42 is formed on the entire surface. Then, the TaN film 42 except that formed on the inside surface and the bottom of the second interconnection groove 40 and the via hole 38 is removed (FIG. 6B).

Figure 7A:
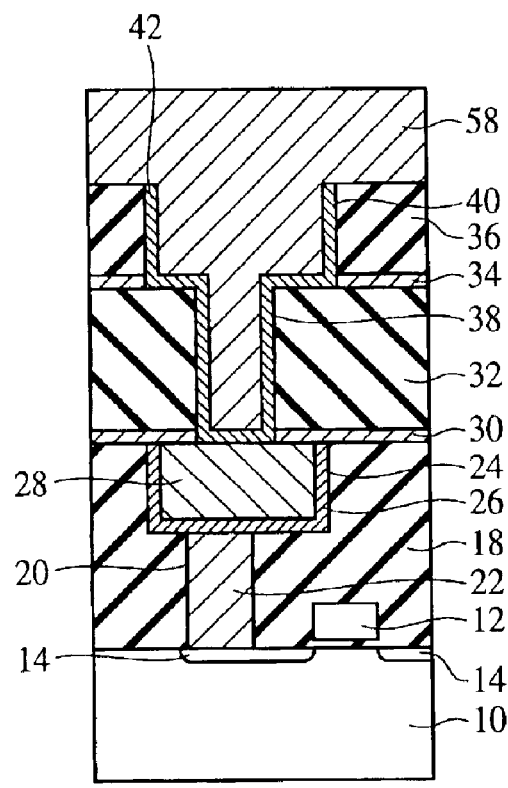
FIGS. 7A and 7B are sectional views of the semiconductor device in the steps of the method for fabricating a semiconductor device according to the first embodiment, which show the method (Part 6).

Next, a Cu film (not shown) is formed on the entire surface by sputtering. Then, with the Cu film formed by sputtering as a seed layer, the Cu film 58 is formed by plating (FIG. 7A).

Figure 7B:
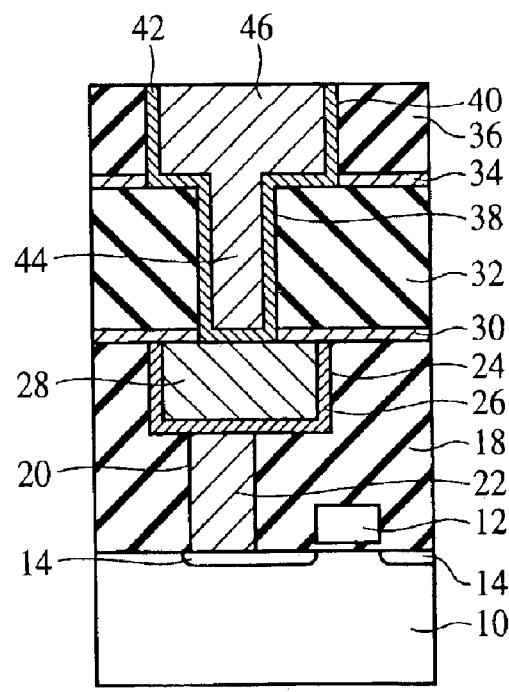

Then, the Cu film 58 is polished by CMP until the surface of the inter-layer insulation film 26 is exposed. Thus, the via layer 44 and the second interconnection layer 46 of the same Cu film 58 are formed in the via hole 38 and the second interconnection groove 40 (FIG. 7B).

Next, the SiN film 48 is formed on the entire surface as a diffusion preventing film for preventing the diffusion of Cu. Thus, the interconnection structure shown in FIG. 1 is fabricated.

Hereafter, the above-described steps are repeated in accordance with a structure of a semiconductor device to be fabricated to form a multi-interconnection layer structure.

As described above, according to the present embodiment, when the via hole and the interconnection groove are simultaneously formed in the inter-layer insulation films by dual damascening, the inter-layer insulation films are etched with the carbon film as a mask, which permits the inter-layer insulation films to be etched at high selective ratios, whereby increase of dimensions of a pattern of the mask with respect to dimensions of a pattern of the resist film used in the patterning can be suppressed. Thus the via hole and the interconnection groove can be formed with high accuracy.

The use of carbon film as the mask permits the inter-layer insulation films of USG to be etched at a high selective ratio, whereby the mask can be thin. Accordingly, the mask can be sufficiently removed in a later step, whereby increase of an inter-layer effective dielectric constant of a multi-interconnection layer structure can be suppressed.

In the present embodiment, the anti-reflecting coating 52 which functions as a protection film for the carbon film 50 is formed of SiN film, but the anti-reflection coating 52 is not essentially formed of SiN film. For example, anti-reflecting coating 52 can be formed of SiON film or others.

As the anti-reflecting coating, BARC (bottom anti-reflection coating) not only of inorganic materials but also organic materials can be used.

[A Second Embodiment]

The method for fabricating a semiconductor device according to a second embodiment of the present invention will be explained with reference to FIGS. 8A–8B to 11A–11B. FIGS. 8A–8B to 11A–11B are sectional views of a semiconductor device in the steps of the method for fabricating a semiconductor device according to the present embodiment, which show the method. The same members of the present embodiment as those of the method for fabricating a semiconductor device according to the first embodiment are represented by the same reference numbers not to repeat or to simplify their explanation.

The method for fabricating a semiconductor device according to the present embodiment is for fabricating a semiconductor device having the structure shown in FIG. 1, as does the method for fabricating a semiconductor device according to the first embodiment. The present embodiment is different from the first embodiment in that in the former, a USG film is formed in place of the anti-reflection coating 52 as the protection film for the carbon film 50 to be used as the mask. The method for fabricating a semiconductor device according to the present embodiment will be explained below.

In the same was as in the first embodiment, a SiN film 30, an inter-layer insulation film 32, a SiN film 34 and an inter-layer insulation film 36 are sequentially formed on an inter-layer insulation film 18 with a conductor plug 22 connected to a source/drain diffused layer 14, and a first interconnection layer 28 connected to the conductor plug 22, formed in.

Figure 8A:
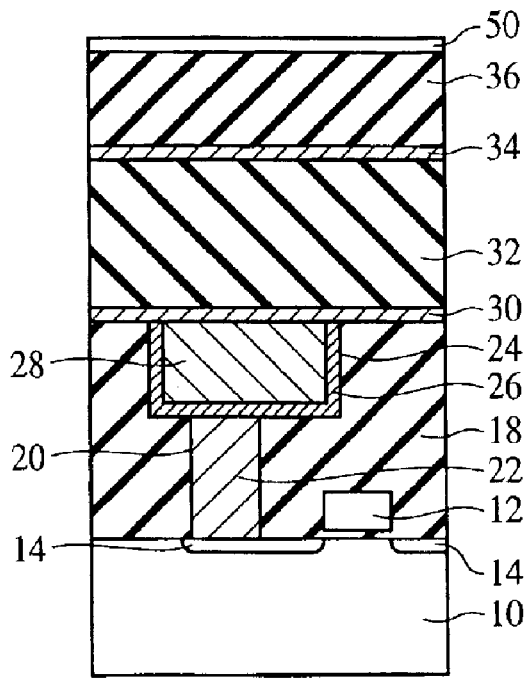
FIGS. 8A and 8B are sectional views of the semiconductor device in the steps of the method for fabricating a semiconductor device according to the second embodiment, which show the method (Part 1).

Then, a carbon film 50 is formed on the inter-layer insulation film 36 by, e.g., CVD (FIG. 8A).

Next, a USG film 60 and a resist film 54 are sequentially formed on the carbon film 50. The USG film 60 will function as a protection film for protecting the carbon film 50 from ashing using oxygen plasmas in the step of removing the resist film 54.

Figure 8B:
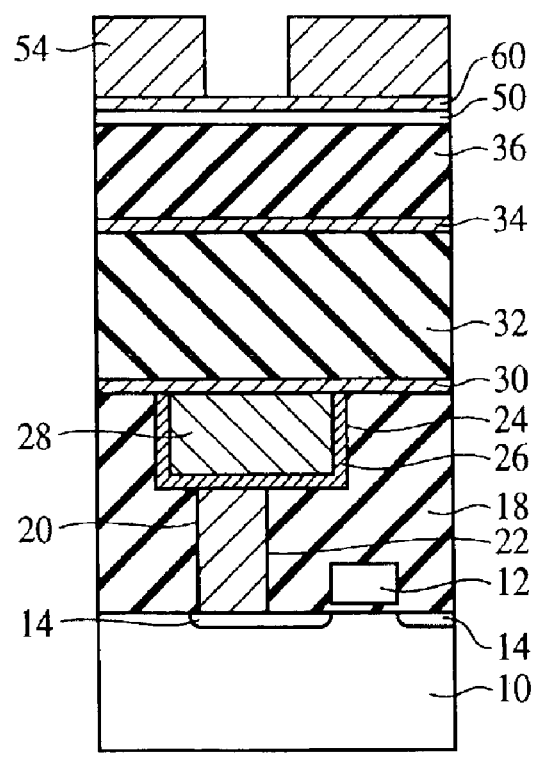

Next, an opening for exposing a region for a via to be formed in is opened in the resist film 54 (FIG. 8B).

Then, with the resist film 54 with the opening formed in as a mask and with the SiN film 34 as an etching stopper film, the USG film 60, the carbon film 50 and the inter-layer insulation film 36 are etched.

Figure 9A:
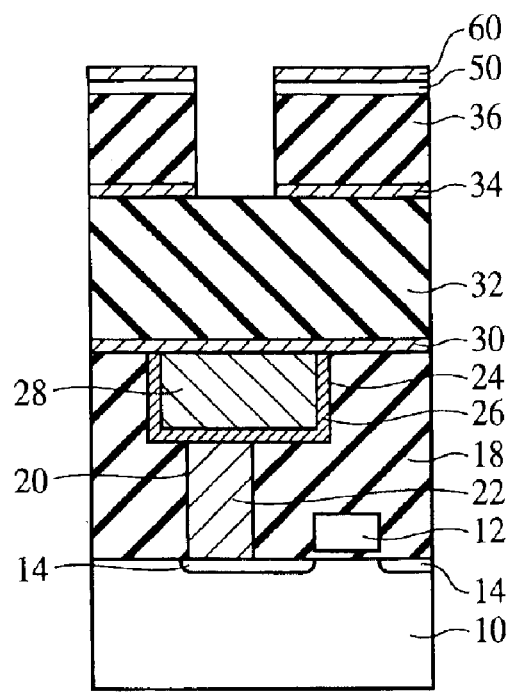
FIGS. 9A and 9B are sectional views of the semiconductor device in the steps of the method for fabricating a semiconductor device according to the second embodiment, which show the method (Part 2).

After the etching is completed, the resist film 54 is removed by ashing using, e.g., oxygen plasmas (FIG. 9A). Because of the USG film 60 formed on the carbon film 50, as in the first embodiment, the carbon film 50 is protected from the ashing. Accordingly, the carbon film 50 is never removed together with the resist film 54.

Figure 9B:
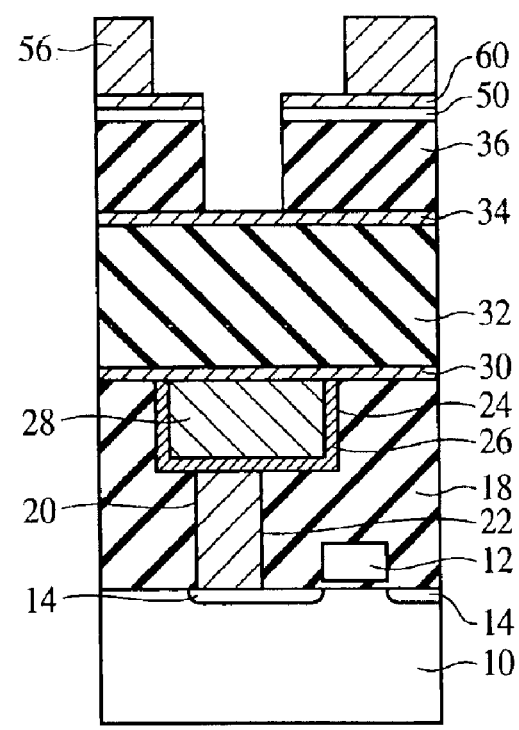

Then, a resist film 56 is formed on the entire surface, an opening for exposing a region for a second interconnection groove 40 to be formed in is opened in the resist film 56 (FIG. 9B).

Next, with the resist film 56 with the opening formed in as a mask, the USG film 60 and the carbon film 50 are etched. The carbon film 50 is thus patterned for forming the second interconnection groove 40. Concurrently therewith, the SiN film 34 which has been used as the etching stopper and exposed by etching the inter-layer insulation film 36 is etched.

Figure 10A:
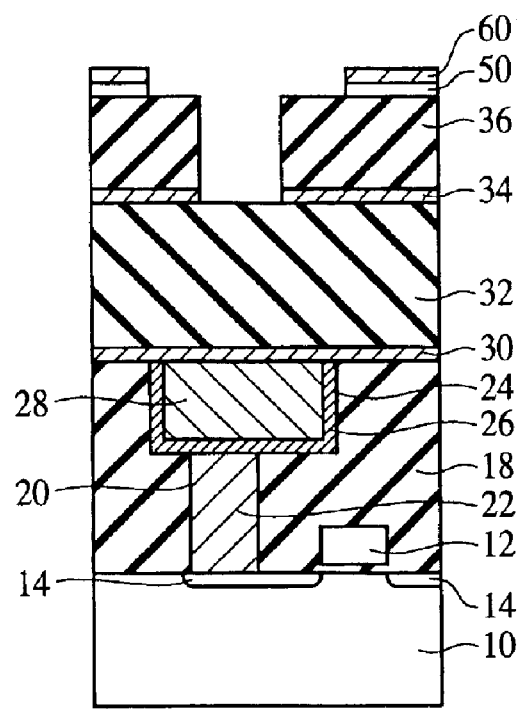
FIGS. 10A and 10B are sectional views of the semiconductor device in the steps of the method for fabricating a semiconductor device according to the second embodiment, which show the method (Part 3).

After the etching is completed, the resist film 56 is removed by ashing using, e.g., oxygen plasmas (FIG. 10A). Because of the USG film 60 formed on the carbon film 50, the carbon film 50 is never removed together with the resist film 56, as is not in removing the resist film 54.

Figure 10B:
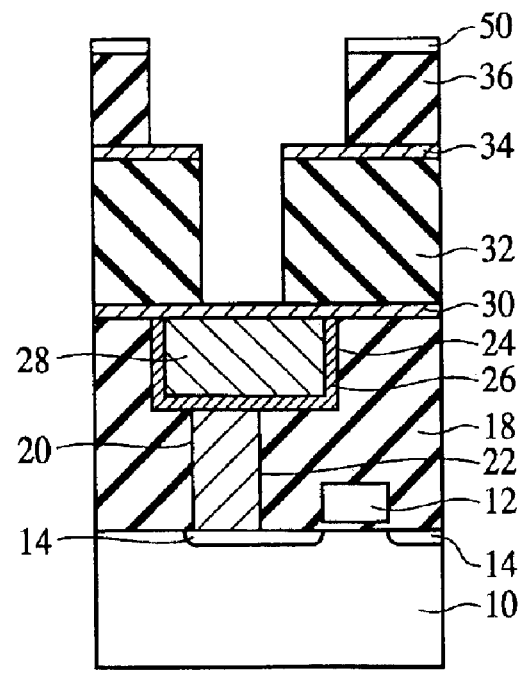

Then, with the carbon film 50 as a mask and with the SiN films 34, 30 as etching stoppers, the inter-layer insulation films 36, 32 are etched. Concurrently therewith, the USG film 60 is also etched (FIG. 10B). As described above, in the present embodiment, when the inter-layer insulation films of USG 36, 32 are etched, the USG film 60 protecting the carbon film 50 from the ashing can be removed by the etching.

Figure 11A:
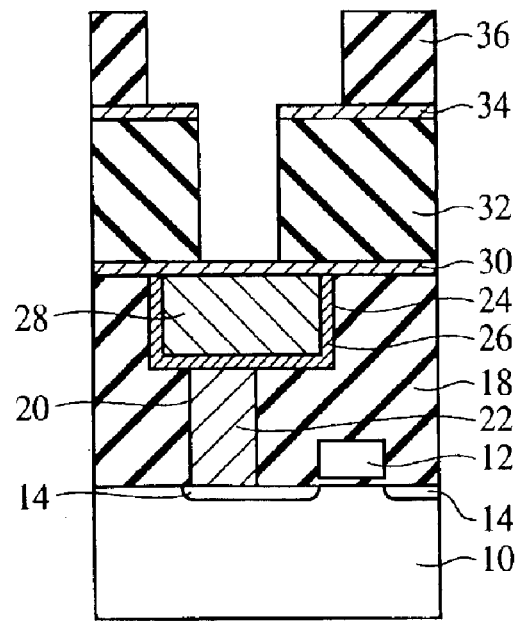
FIGS. 11A and 11B are sectional views of the semiconductor device in the steps of the method for fabricating a semiconductor device according to the second embodiment, which show the method (Part 4).

Then, the carbon film used as the mask is removed (FIG. 11A).

Figure 11B:
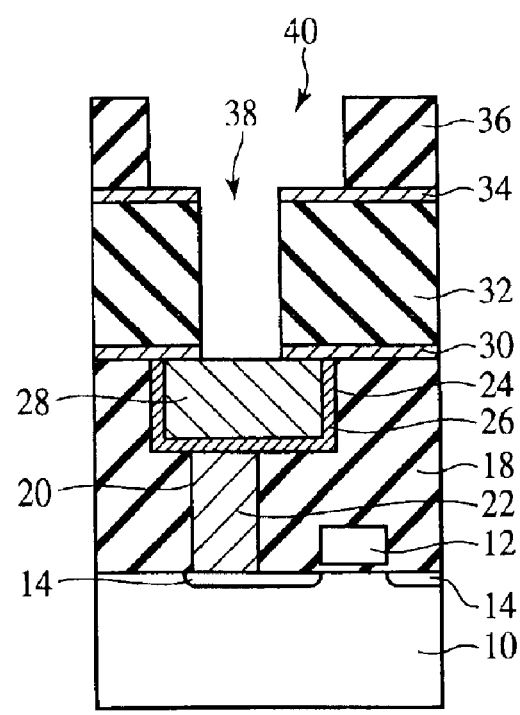
Figure 12A:
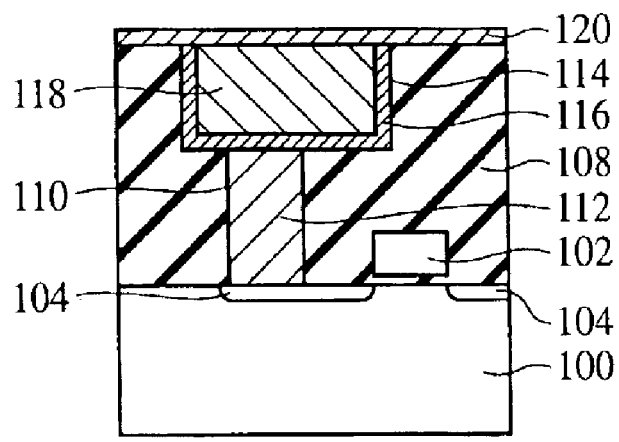
FIGS. 12A and 12B are sectional views of a multi-interconnection layer structure formed by the conventional dual damascening in the steps thereof, which show the conventional dual damascening (Part 1).
Figure 12B:
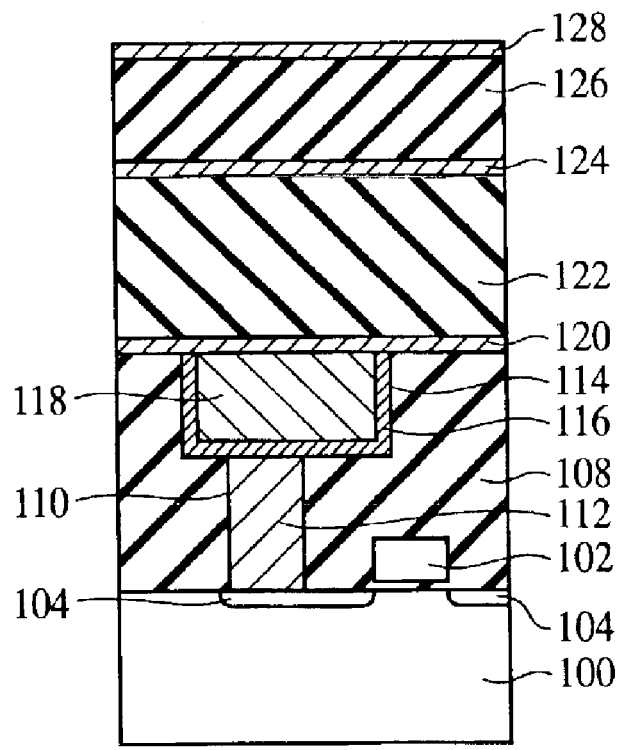
Figure 13A:
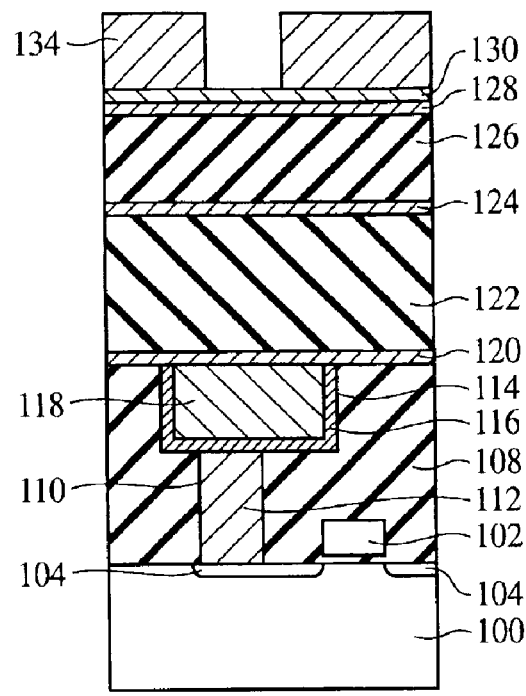
FIGS. 13A and 13B are sectional views of a multi-interconnection layer structure formed by the conventional dual damascening in the steps thereof, which show the conventional dual damascening (Part 2).
Figure 13B:
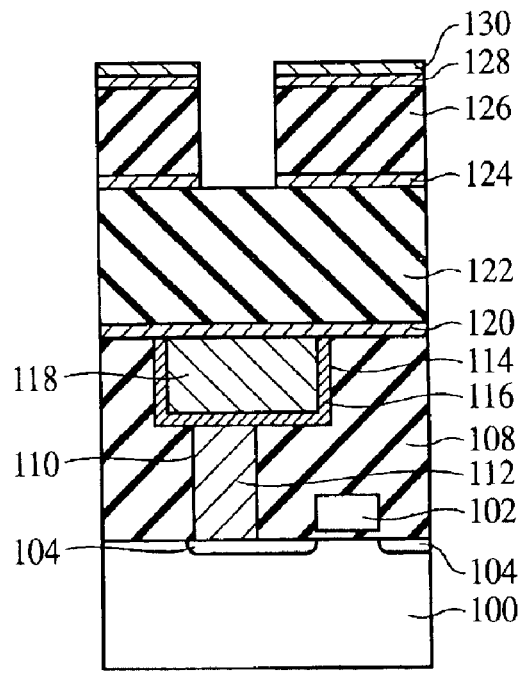
Figure 14A:
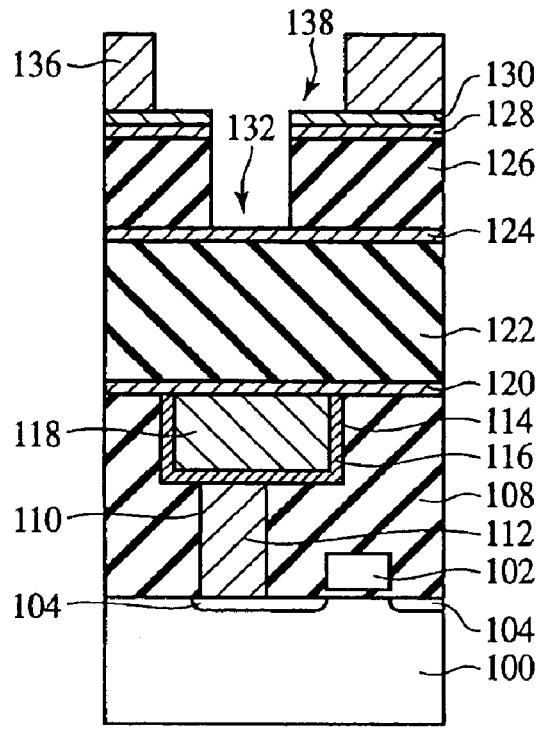
FIGS. 14A and 14B are sectional views of a multi-interconnection layer structure formed by the conventional dual damascening in the steps thereof, which show the conventional dual damascening (Part 3).
Figure 14B:
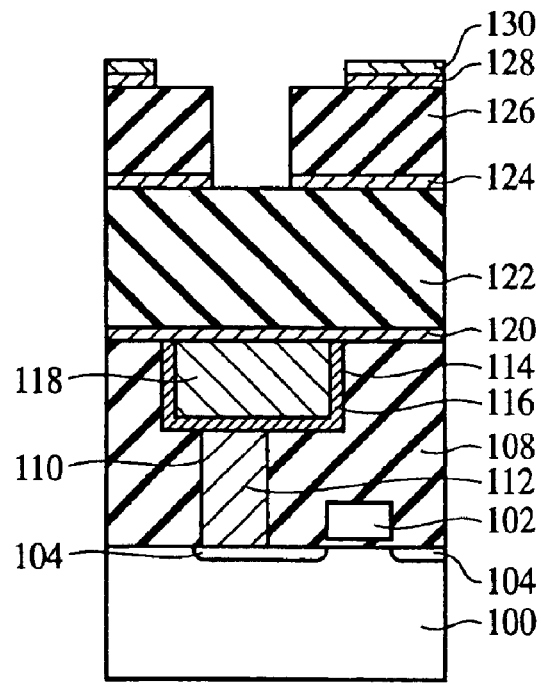
Figure 15A:
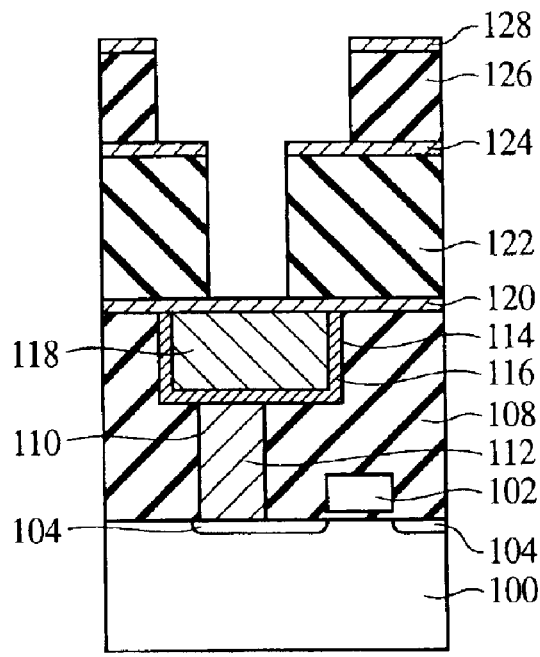
FIGS. 15A and 15B are sectional views of a multi-interconnection layer structure formed by the conventional dual damascening in the steps thereof, which show the conventional dual damascening (Part 4).
Figure 15B:
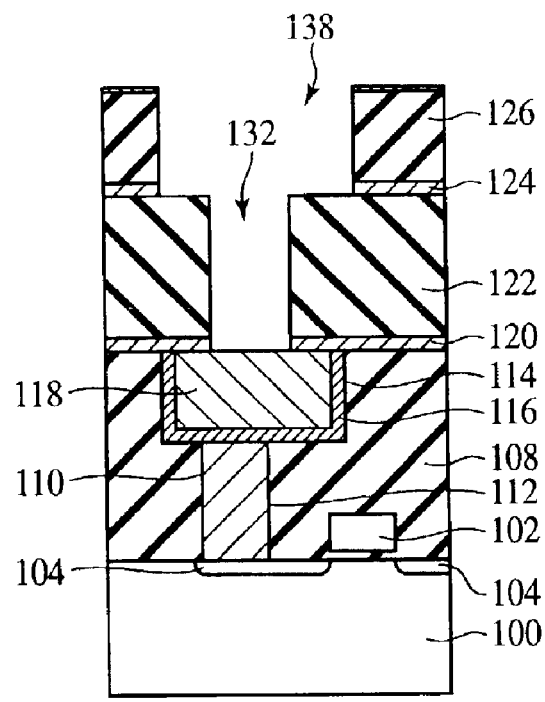
Figure 16A:
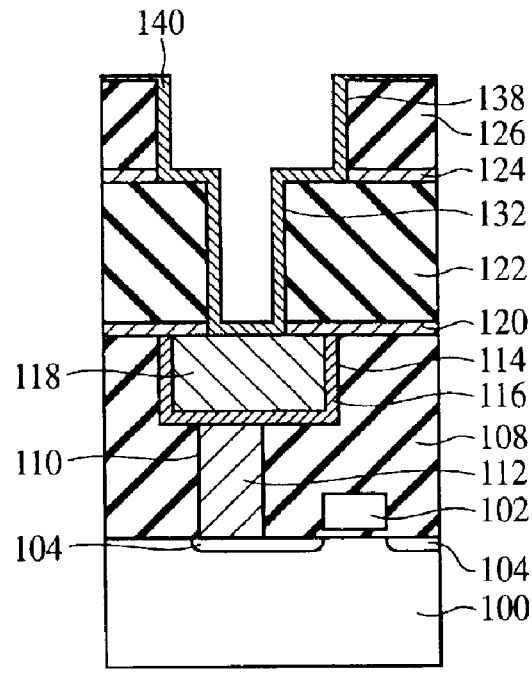
FIGS. 16A and 16B are sectional views of a multi-interconnection layer structure formed by the conventional dual damascening in the steps thereof, which show the conventional dual damascening (Part 5).
Figure 16B:
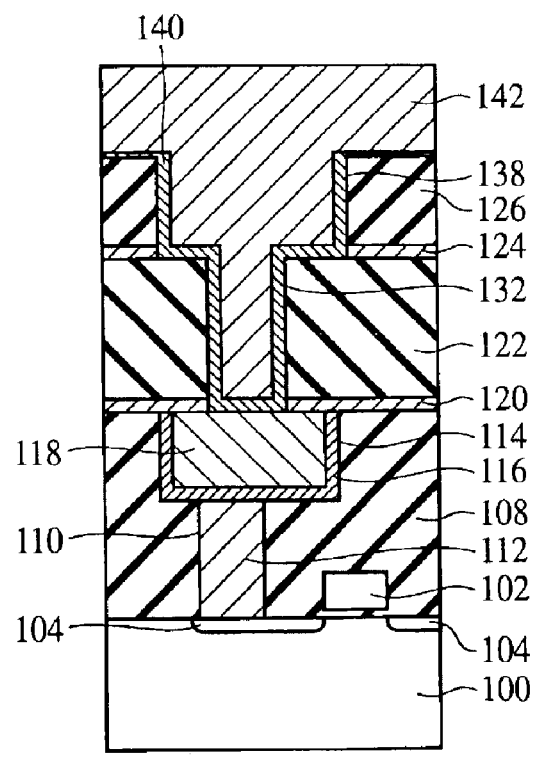
Figure 17A:
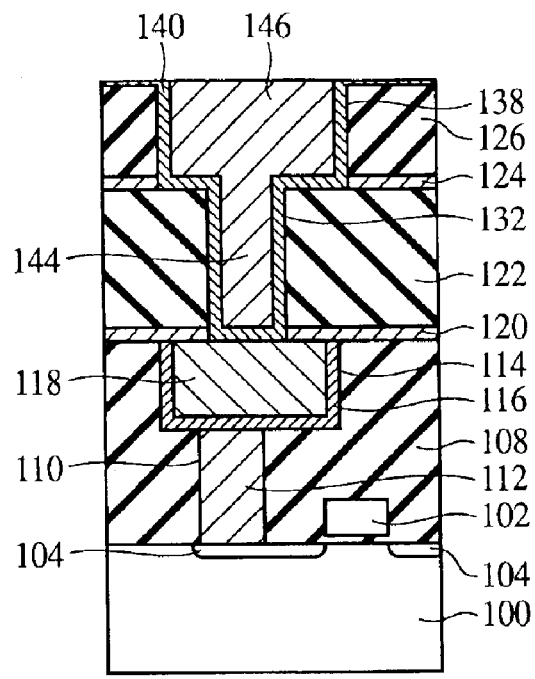
FIGS. 17A and 17B are sectional views of a multi-interconnection layer structure formed by the conventional dual damascening in the steps thereof, which show the conventional dual damascening (Part 6).
Figure 17B:
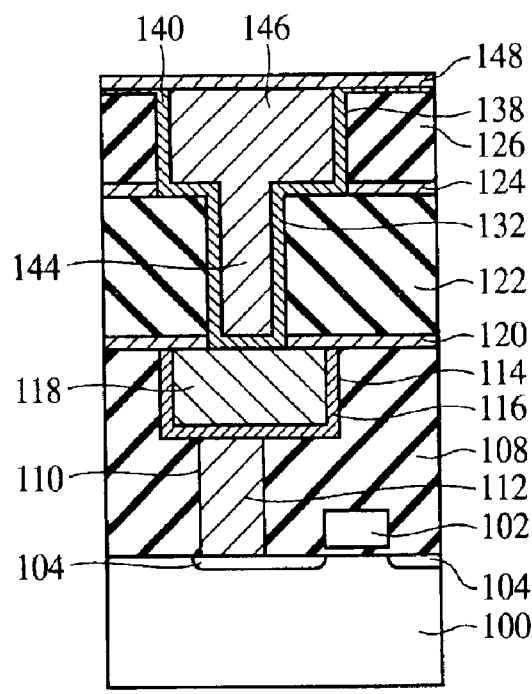

Next, the SiN films 34, 30 which has been used as the etching stoppers and exposed by etching the inter-layer insulation films 36, 31 are etched. Thus, a via hole 30 arriving at the first inter-connection layer 28 and a second interconnection groove 40 are formed (FIG. 11B).

Then, in the same way as in the first embodiment, a TaN film 42 is formed, and then a Cu film is buried in the via hole 38 and the second interconnection groove 40 to form a via layer 44 and a second interconnection layer 46. Next, a SiN film 48 is formed on the entire surface as a diffusion protecting film for preventing the diffusion of the Cu. Thus, the inter-connection layer structure shown in FIG. 1 is fabricated.

As described above, according to the present embodiment, when the via hole and the interconnection groove are simultaneously formed in the inter-layer insulation films by dual damascening, the inter-layer insulation films are etched with the carbon film as a mask, which permits the inter-layer insulation films to be etched at high selective ratios, whereby increase of dimensions of a pattern of the mask with respect to dimensions of a pattern of the resist film used in the patterning can be suppressed. Thus the via hole and the interconnection groove can be formed with high accuracy.

The use of carbon film as the mask permits the inter-layer insulation films of USG to be etched at high selective ratios, whereby the mask can be thin. Accordingly, the mask can be sufficiently removed in a later step, whereby increase of an inter-layer effective dielectric constant of a multi-interconnection layer structure can be suppressed.

In the present embodiment, the USG film 60 as the protection film for protecting the carbon film 50 from the ashing is used, and the inter-layer insulation films are formed of USG film. However, the protection film is not essentially formed of the USG film 60 and may be formed of a material other than the USB film 60 as long as the material has substantially the same ashing rate as a material of the inter-layer insulation films. The protection film is formed of a material having substantially the same ashing rate as a material of the inter-layer insulation films, whereby the protection film can be removed when the inter-layer insulation films are etched.

[Modified Embodiments]

The present invention is not limited to the above-described embodiments and can cover other various modifications.

For example, in the above-described embodiments, in the dual damascening, the inter-layer insulation films are etched by using the carbon film 50 as a mask. However, the use of the carbon film 50 as the mask is not limited the dual damascening. The carbon film of the present invention is used as a mask for, e.g., forming contact holes of micronized high aspect ratios. The aspect ratio of contact holes tend to be higher as the micronization advances, and in patterning resists by direct writing with ArF steppers or EB, the resists are increasingly thinned. In such case, the carbon film of the present invention is used as a mask, whereby micronized contact hole diameters can be realized In the above-described embodiments, the carbon film 50 is used as a mask. However, the carbon film may be a carbon-based film and can be a film having an above 50% carbon content.

In the above-described embodiments, the inter-layer insulation films are formed of USG film but are not essentially formed of USG film. The inter-layer insulation film can be formed of, e.g., FSG (Fluorinated Silicate Glass) film, BSG (Boron Silicate Glass) film, PSG (Phospho Silicate Glass) film, BPSG (Boron Phospho Silicate Glass) film, oxide silicon-based insulation films such as SiOC film, or others. The inter-layer insulation films may be formed of porous oxide silicon film.

In the above-described embodiments, as the protection film for protecting the carbon film from the ashing using oxygen plasmas, or others for removing the resist films 54. 56, the anti-reflection coating 52 and the USG film 60 are used. However, the protection film for protecting the carbon film 50 is not limited to them. For example, SiC film or others may be used as the protection film for protecting the carbon film 50 from the ashing. When SiC film is used as the protection film, a high selective ratio for etching the inter-layer insulation films can be obtained, which can make the carbon film 50 as the mask thinner.

In the above-described embodiments, TaN film is used as the barrier film for preventing the diffusion of Cu to the inter-layer insulation films. However, the barrier insulation film can be any film as long as the film can prevent the diffusion of metals of the interconnection layers. For example, TiN film, etc. can be used.

In the above-described embodiments, SiN film is used as the etching stopper for etching the inter-layer insulation films, but the etching stopper film is not limited to SiN film. Any film can be used as long as the film can function as the etching stopper for etching the inter-layer insulation films.

What is claimed is:

1. A method for fabricating a semiconductor device comprising the steps of:
   sequentially forming over a substrate an insulation film, a carbon film and a protection film protecting the carbon film from ashing;
   forming a resist film with an opening in a prescribed region on the protection film;
   etching the protection film and the carbon film with the resist film as a mask;
   removing the resist film by ashing; and
   etching the insulation film with the carbon film as a mask.

2. A method for fabricating a semiconductor device according to claim 1, wherein
   in the step of forming an insulation film, the insulation film includes a first film having etching characteristics substantially equal to those of the protection film, and a second film having etching characteristics different from those of the first film, and
   in the step of etching the insulation film, with the first film as an etching stopper film, the second film is etched, and then the first film is etched together with the protection film.

3. A method for fabricating a semiconductor device according to claim 2, wherein
   the insulation film is a silicon oxide-based insulation film.

4. A method for fabricating a semiconductor device according to claim 1, wherein
   the protection film has etching characteristics substantially equal to those of the insulation film, and
   in the step of etching the insulation film, the insulation film is etched together with the protection film.

5. A method for fabricating a semiconductor device according to claim 4, wherein
   the insulation film is a silicon oxide-based insulation film.

6. A method for fabricating a semiconductor device according to claim 1, wherein
   the insulation film is a silicon oxide-based insulation film.

7. A method for fabricating a semiconductor device according to claim 1, wherein
   the protection film functions as an anti-reflection coating for patterning the resist film.

8. A method for fabricating a semiconductor device according claim 1, wherein
   the protection film is SiN film, USG film, SiON film or SiC film.

9. A method for fabricating a semiconductor device comprising the steps of:
   sequentially forming over a substrate a first insulation film, a second insulation film having etching characteristics different from those of the first insulation film, and a third insulation film having etching characteristics different from those of the second insulation film;
   forming a carbon film having a first opening in a first region on the third insulation film;
   anisotropically etching the third insulation film and the second insulation film in the first region;
   forming a second opening in the carbon film in a second region containing the first region; and
   anisotropically etching the first insulation film and the third insulation film with the carbon film and the second insulation film as a mask to form a via hole in the first insulation film in the first region, and a interconnection groove in the third insulation film in the second region.

10. A method for fabricating a semiconductor device according to claim 9, wherein
    the first insulation film and/or the third insulation film is a silicon oxide-based insulation film.

11. A method for fabricating a semiconductor device according to claim 9, wherein
    the step of forming the carbon film comprises the steps of sequentially forming on the third insulation film the carbon film, a protection film for protecting the carbon film from ashing, and a first resist film having an opening in the first region, etching the protection film and the carbon film with the first resist film as a mask, and removing the first resist film by ashing, and
    the step of forming the second opening comprises the steps of forming a second resist film having an opening in a second region on the protection film, etching the protection film and the carbon film with the second resist film as a mask, and removing the second resist film by ashing.

12. A method for fabricating a semiconductor device according to claim 11, which further comprises
    before the step of forming a first insulation film the step of forming a fourth insulation film having etching characteristics different from those of the first insulation film and substantially equal to those of the protection film, and in which
    in the step of anisotropically etching the first insulation film, the first insulation film is etched with the fourth insulation film as a stopper, and then the fourth insulation film is etched together with the protection film, and a thickness of the protection film is set so that the protection film is removed substantially concurrently with removing the fourth insulation film.

13. A method for fabricating a semiconductor device according to claim 12, wherein
    the first insulation film and/or the third insulation film is a silicon oxide-based insulation film.

14. A method for fabricating a semiconductor device according to claim 11, wherein
    the protection film has etching characteristics substantially equal to those of the first insulation film and the third insulation film, and
    in the step of anisotropically etching the first insulation film and the third insulation film, the first insulation film and the third insulation film are etched while the protection film is etched.

15. A method for fabricating a semiconductor device according to claim 11, wherein
    the protection film functions as an anti-reflection coating for patterning the resist film.

16. A method for fabricating a semiconductor device according to claim 11, wherein the first insulation film and/or the third insulation film is a silicon oxide-based insulation film.

17. A method for fabricating a semiconductor device according claim 11, wherein the protection film is SiN film, USG film, SiON film or SiC film.

* * * * *